(12) United States Patent
Wyrzykowska et al.

(10) Patent No.: US 7,256,354 B2
(45) Date of Patent: Aug. 14, 2007

(54) TECHNIQUE FOR REDUCING THE NUMBER OF LAYERS IN A MULTILAYER CIRCUIT BOARD

(76) Inventors: Aneta O. Wyrzykowska, 52 Shearer Crest, Kanata, ON (CA), k2L 3N2; Luigi G. Difilippo, 23 Hemlo Cres., Kanata, ON (CA), K2T 1C7; Herman Kwong, 15 Hewitt Way, Kanata, ON (CA), K2L 3S2

( * ) Notice: Subject to any disclaimer, the term of this patent is extended or adjusted under 35 U.S.C. 154(b) by 0 days.

(21) Appl. No.: 10/101,211

(22) Filed: Mar. 20, 2002

(65) Prior Publication Data

US 2004/0040744 A1 Mar. 4, 2004

Related U.S. Application Data

(63) Continuation-in-part of application No. 09/651,188, filed on Aug. 30, 2000, now Pat. No. 6,388,890.

(60) Provisional application No. 60/212,387, filed on Jun. 19, 2000.

(51) Int. Cl.
  *H01R 12/04* (2006.01)
  *H05K 1/11* (2006.01)
  *H05K 1/14* (2006.01)
  *H01K 3/10* (2006.01)

(52) U.S. Cl. .................. 174/262; 174/262; 361/794; 29/852

(58) Field of Classification Search ............ 361/767, 361/768, 777, 780, 792–795; 174/255, 261, 174/262–266; 257/691, 698, 700–703, 786; 333/246, 247; 29/846, 852–853; 438/125
See application file for complete search history.

(56) References Cited

U.S. PATENT DOCUMENTS 5,451,721 A    9/1995   Tsukada et al.
5,544,018 A  * 8/1996   Sommerfeldt et al. ...... 361/792

(Continued)

FOREIGN PATENT DOCUMENTS

EP    1087440 A2   3/2001
FR    2782230 A1   2/2000

(Continued)

OTHER PUBLICATIONS

European Search Report dated Jun. 8, 2004 for Application No. EP 03 39 4085.
European Search Report dated Jun. 8, 2004 for Application No. EP 03 39 4086.

(Continued)

*Primary Examiner*—Jeremy C. Norris

(57) ABSTRACT

A technique for reducing the number of layers in a multilayer circuit board having a plurality of electrically conductive signal layers for routing electrical signals to and from a surface of the multilayer circuit board is disclosed. The technique is realized by a method comprising: forming a plurality of electrically conductive vias in the multilayer circuit board extending from the surface of the multilayer circuit board to at least one of the plurality of electrically conductive signal layers; arranging the surface such that a first set of two power/ground pins corresponds to a first via and a second set of two power/ground pins corresponds to a second via positioned adjacent the first via, thereby creating a channel; and routing a first plurality of electrical signals through the channel on the first of the plurality of electrically conductive signal layers.

31 Claims, 15 Drawing Sheets

U.S. PATENT DOCUMENTS

| | | | |
|---|---|---|---|
| 5,784,262 A | | 7/1998 | Sherman |
| 5,847,936 A | | 12/1998 | Forehand et al. |
| 6,181,004 B1 | | 1/2001 | Koontz et al. |
| 6,198,635 B1 | * | 3/2001 | Shenoy et al. ............. 361/760 |
| 6,232,564 B1 | | 5/2001 | Arndt et al. |
| 6,256,769 B1 | | 7/2001 | Tamarkin et al. |
| 6,310,398 B1 | * | 10/2001 | Katz .......................... 257/773 |
| 6,355,890 B1 | | 3/2002 | Kuroda |
| 6,388,890 B1 | | 5/2002 | Kwong et al. |
| 6,407,343 B1 | * | 6/2002 | Tanaka ....................... 174/261 |
| 6,407,462 B1 | * | 6/2002 | Banouvong et al. ........ 257/787 |
| 6,452,262 B1 | * | 9/2002 | Juneja ......................... 257/691 |
| 6,479,319 B1 | * | 11/2002 | Mora et al. ................. 438/106 |
| 6,521,846 B1 | * | 2/2003 | Freda et al. ................ 174/260 |
| 6,538,213 B1 | * | 3/2003 | Carden et al. .............. 174/262 |
| 6,762,366 B1 | * | 7/2004 | Miller et al. ................ 174/250 |
| 2002/0185302 A1 | * | 12/2002 | Henson ....................... 174/255 |
| 2003/0043560 A1 | | 3/2003 | Clarkson et al. |
| 2003/0183419 A1 | * | 10/2003 | Miller et al. ................. 174/261 |

FOREIGN PATENT DOCUMENTS

| | | | |
|---|---|---|---|
| JP | H05-54103 | | 3/1993 |
| JP | H07-141409 | | 6/1995 |
| JP | H10-134098 | | 5/1998 |
| JP | H11-297885 | | 10/1999 |
| JP | 2001-34643 | | 2/2001 |
| JP | 2001274288 A | * | 10/2001 |
| JP | 2001-274288 | | 10/2001 |
| JP | 2001-351983 | | 12/2001 |

OTHER PUBLICATIONS

European Search Report dated Jun. 8, 2004 for Application No. EP 03 39 4085.

European Search Report dated Jun. 8, 2004 for Application No. EP 03 39 4086.

* cited by examiner

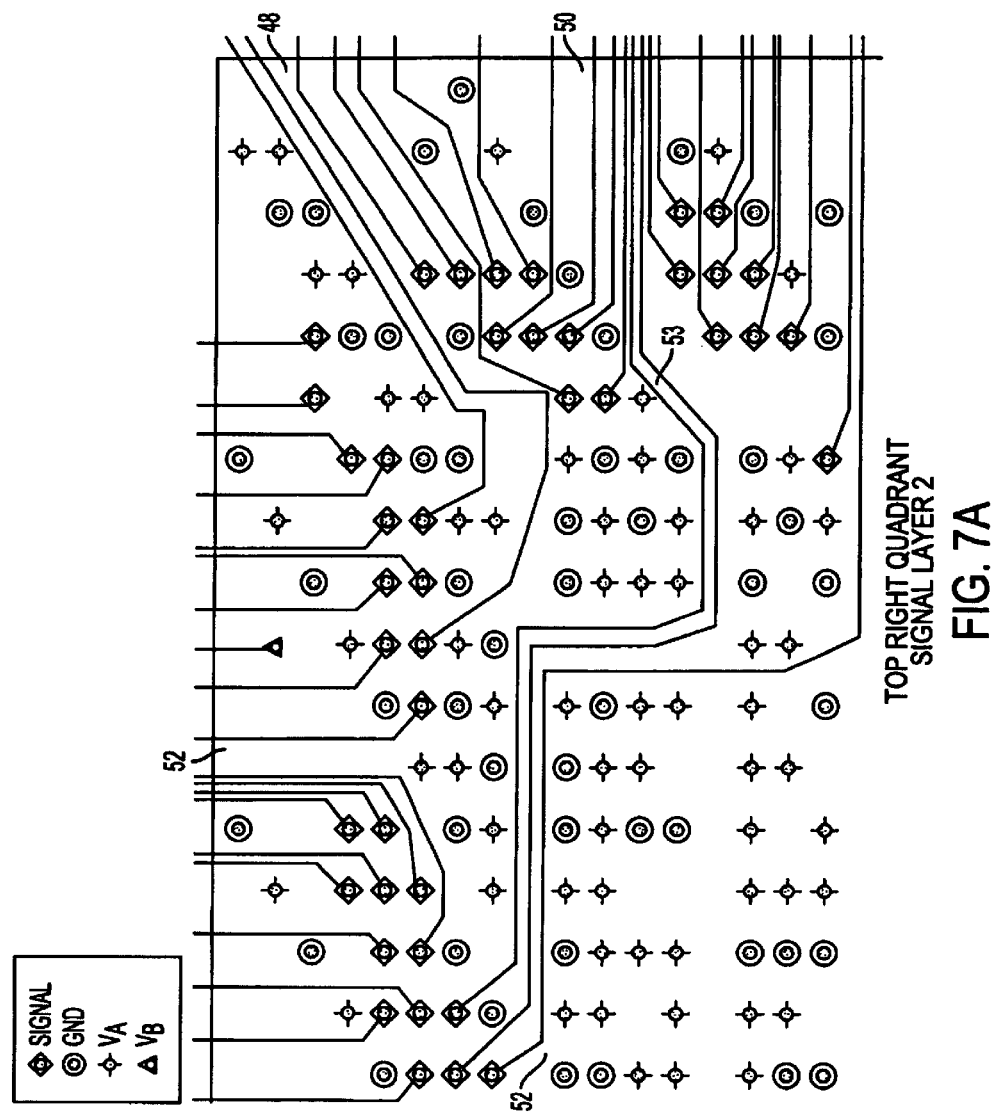

TECHNIQUE FOR REDUCING THE NUMBER OF LAYERS IN A MULTILAYER CIRCUIT BOARD

CROSS-REFERENCE TO RELATED APPLICATIONS

This patent application is a Continuation-In-Part of U.S. patent application Ser. No. 09/651,188 Client Reference No. 12623ROUS02U), filed Aug. 30, 2000 now U.S. Pat. No. 6,388,890, which claims priority from U.S. Provisional Patent Application No. 60/212,387 filed Jun. 19, 2000, both of which are hereby incorporated by reference herein in their entirety.

FIELD OF THE INVENTION

The present invention relates generally to multilayer circuit boards and, more particularly, to a technique for reducing the number of layers in a multilayer circuit board.

BACKGROUND OF THE INVENTION

The making of electrical connections between electronic components has long been accomplished using printed circuit boards. The first such circuit boards had only a single signal layer on a top surface thereof for routing electrical signals between electronic components mounted thereon. These single signal layer circuit boards have severe limitations with regard to the number of electrical signals that can be routed between electronic components mounted on the same circuit board. That is, the number of electrical signals that can be routed between electronic components mounted on a single signal layer circuit board is limited by the amount of area on the single signal layer.

The area limitations associated with single signal layer circuit boards led to the development of multilayer printed circuit boards. Such multilayer printed circuit boards may be either single or double-sided and may have multiple signal layers on the surface of and buried within the multilayer printed circuit boards. Thus, such multilayer printed circuit boards have allowed a large increase in the number of electrical signals that may be routed between electronic components mounted on the same circuit board.

The use of multilayer printed circuit boards has been particularly beneficial when using electronic components having high density packages. That is, electronic components having high density packages generally require multiple layers of a multilayer printed circuit board to make electrical connections with other electronic components mounted on the same circuit board. In fact, the density of electronic component packages typically dictates the number of layers that must be provided by the multilayer printed circuit board upon which the electronic component is mounted. While the number of layers that may be provided by a multilayer printed circuit board is theoretically unlimited, problems occur when the number of layers in a multilayer printed circuit board exceeds a reasonable number, particularly when trying to route high speed electrical signals between electronic components. For example, when making electrical connections between different layers in multilayer printed circuit boards, electrically conductive vias are generally used. While these electrically conductive vias allow direct vertical electrical connections to be made between different layers within a multilayer printed circuit board, there are intrinsic parasitics associated with these electrically conductive vias that can adversely affect the performance of signals propagating therethrough. That is, these electrically conductive vias have intrinsic parasitic resistance, capacitance, and inductance, which can adversely affect signals propagating along each electrically conductive via. In addition, these intrinsic parasitics can also have an adverse effect on the manufacturability of a printed circuit board and thus the cost thereof. Because of their adverse affect on signal performance, these intrinsic parasitics can also limit the bandwidth of signals propagating along each electrically conductive via. These adverse affects only increase as the number of layers in a multilayer printed circuit board increase.

Co-pending U.S. patent application Ser. No. 09/651,188, which is fully incorporated by reference, is directed to signal channel routing and also aims to reduce the number of layers in a multilayer circuit board. However, even with the use of the disclosed signal channel routing technique, further improvement is desired.

In view of the foregoing, it would be desirable to provide a technique for increasing the number of electrical connections that may be made between electronic components mounted on a multilayer printed circuit board without increasing the number of layers in the multilayer printed circuit board. More particularly, it would be desirable to provide a technique for reducing the number of layers in a multilayer circuit board in an efficient and cost effective manner.

SUMMARY OF THE INVENTION

According to the present invention, a technique for reducing the number of layers in a multilayer circuit board is provided. The multilayer circuit board has a plurality of electrically conductive signal layers for routing electrical signals to and from at least one electronic component mounted on a surface of the multilayer circuit board. In a preferred embodiment, the technique is realized by forming a plurality of electrically conductive vias in the multilayer circuit board extending from the surface of the multilayer circuit board to at least one of the plurality of electrically conductive signal layers. The technique is further realized by arranging the surface such that a first set of at least two power/ground pins corresponds to a first via and a second set of at least two power/ground pins corresponds to a second via positioned adjacent the first via, thereby creating a channel on the surface and a channel on a first of the plurality of signal layers, and routing a first plurality of electrical signals through the channel on the first of the plurality of electrically conductive signal layers.

In accordance with other aspects of the present invention, an improved multilayer circuit board is provided. The multilayer circuit board has a plurality of electrically conductive signal layers for routing electrical signals to and from at least one electronic component mounted on a surface of the multilayer circuit board. The multilayer circuit board comprises a plurality of electrically conductive vias in the multilayer circuit board extending from the surface of the multilayer circuit board to at least one of the plurality of electrically conductive signal layers. The multilayer circuit board additionally comprises a first set of at least two power/ground pins corresponding to a first via and a second set of at least two power/ground pins corresponding to a second via positioned adjacent the first via, arranged to create a channel on the surface and a channel on a first of the plurality of signal layers,. The multilayer circuit board additionally comprises a first plurality of electrical signal paths routed through the channel on the first of the plurality of electrically conductive signal layers.

In accordance with further aspects of the present invention, the plurality of electrically conductive signal layers are typically separated by at least one dielectric layer. Also, at least some of the plurality of electrically conductive signal layers are typically separated by at least one electrically conductive power/ground plane layer. Further, the surface of the multilayer circuit board is typically primarily an electrically conductive power/ground plane layer.

The present invention will now be described in more detail with reference to exemplary embodiments thereof as shown in the appended drawings. While the present invention is described below with reference to preferred embodiments, it should be understood that the present invention is not limited thereto. Those of ordinary skill in the art having access to the teachings herein will recognize additional implementations, modifications, and embodiments, as well as other fields of use, which are within the scope of the present invention as disclosed and claimed herein, and with respect to which the present invention could be of significant utility.

BRIEF DESCRIPTION OF THE DRAWINGS

In order to facilitate a more full understanding of the present invention, reference is now made to the appended drawings. These drawings should not be construed as limiting the present invention, but are intended to be exemplary only.

FIG. 7A shows a portion of a second signal layer of the multilayer printed circuit board shown in FIG. 1.

DETAILED DESCRIPTION OF EXEMPLARY EMBODIMENT(S)

Figure 1:
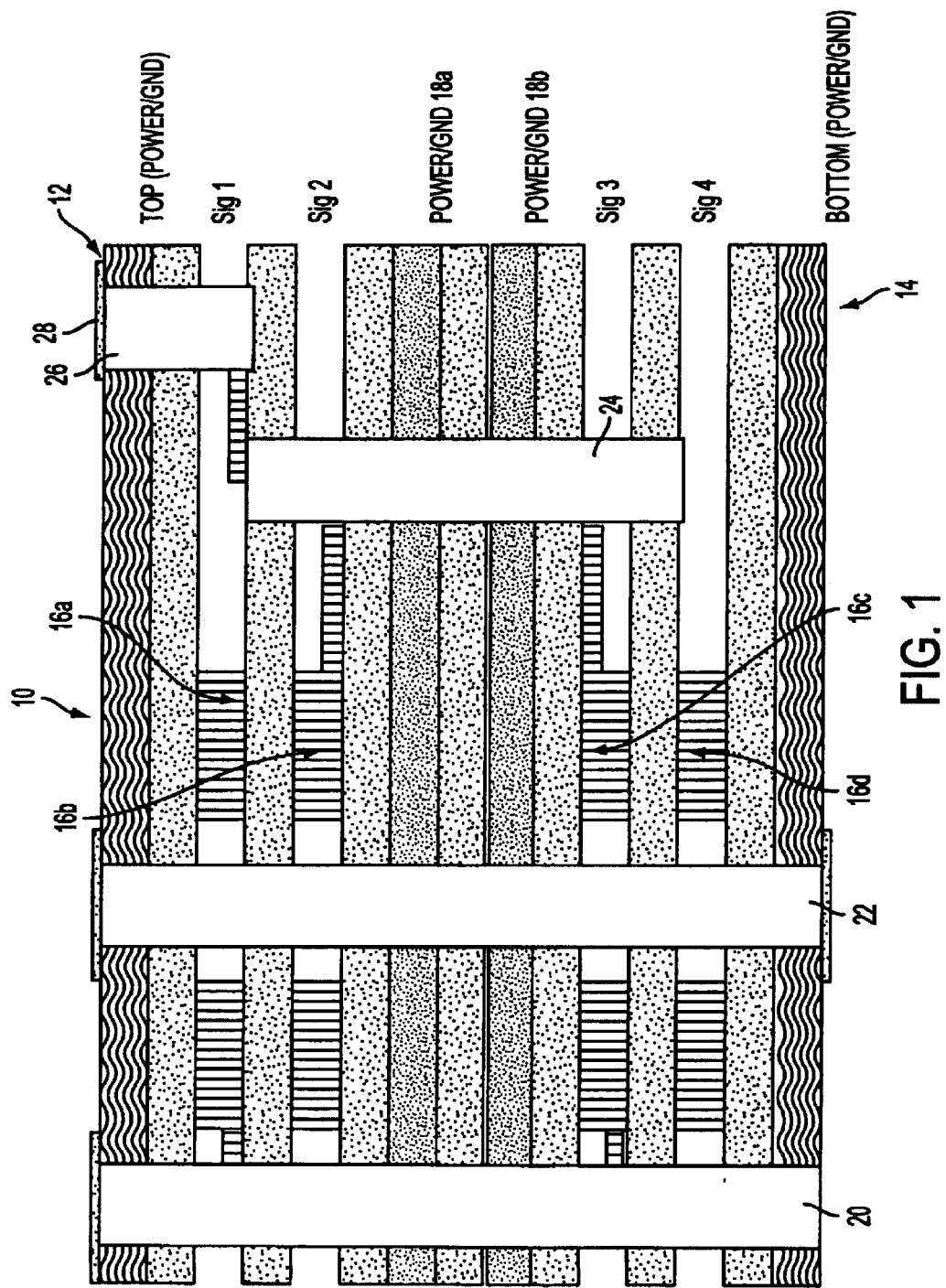
FIG. 1 is a side cross-sectional view of a multilayer printed circuit board in accordance with the present invention.

A power routing technique of the invention is designed to optimize the free channel routing technique which is disclosed in U.S. patent application Ser. No. 09/651,188, which is hereby incorporated by reference. As shown in FIG. 1, the previously disclosed technique includes a multilayer printed circuit board 10. That is, the multilayer printed circuit board 10 incorporates the concepts of the present invention so as to reduce the number of layers in the multilayer printed circuit board 10.

The multilayer printed circuit board 10 comprises a primary (top) layer 12, a secondary (bottom) layer 14, a plurality of signal layers 16, and a plurality of power/ground plane layers 18. It should be noted that the primary layer 12 and the secondary layer 14 are primarily power/ground plane layers except for contact pads and test signal runs formed thereon, as will be described in more detail below.

The multilayer printed circuit board 10 also comprises a first supervia (through hole) 20 for electrically connecting selected ones of the plurality of signal layers 16 (i.e., signal layers 16a and 16c), a second supervia (through hole) 22 for electrically connecting the primary layer 12, the secondary layer 14, and selected ones of the plurality of power/ground plane layers 18 (i.e., power/ground plane layers 18a or 18b, a buried via 24 for electrically connecting selected ones of the plurality of signal layers 16 (i.e., signal layers 16a and 16d), and a microvia 26 for electrically connecting signal layer 16a to a contact pad 28 formed on the primary layer 12.

The presently disclosed technique can be used in conjunction with the multilayer printed circuit board 10 shown in FIG. 1, or alternatively can be used independently to design clear channels through which additional routing or breakouts can be achieved. Accordingly, the multilayer printed circuit board 10 of FIG. 1 is merely exemplary as a conventional multilayer circuit board could readily be employed.

Figure 2:
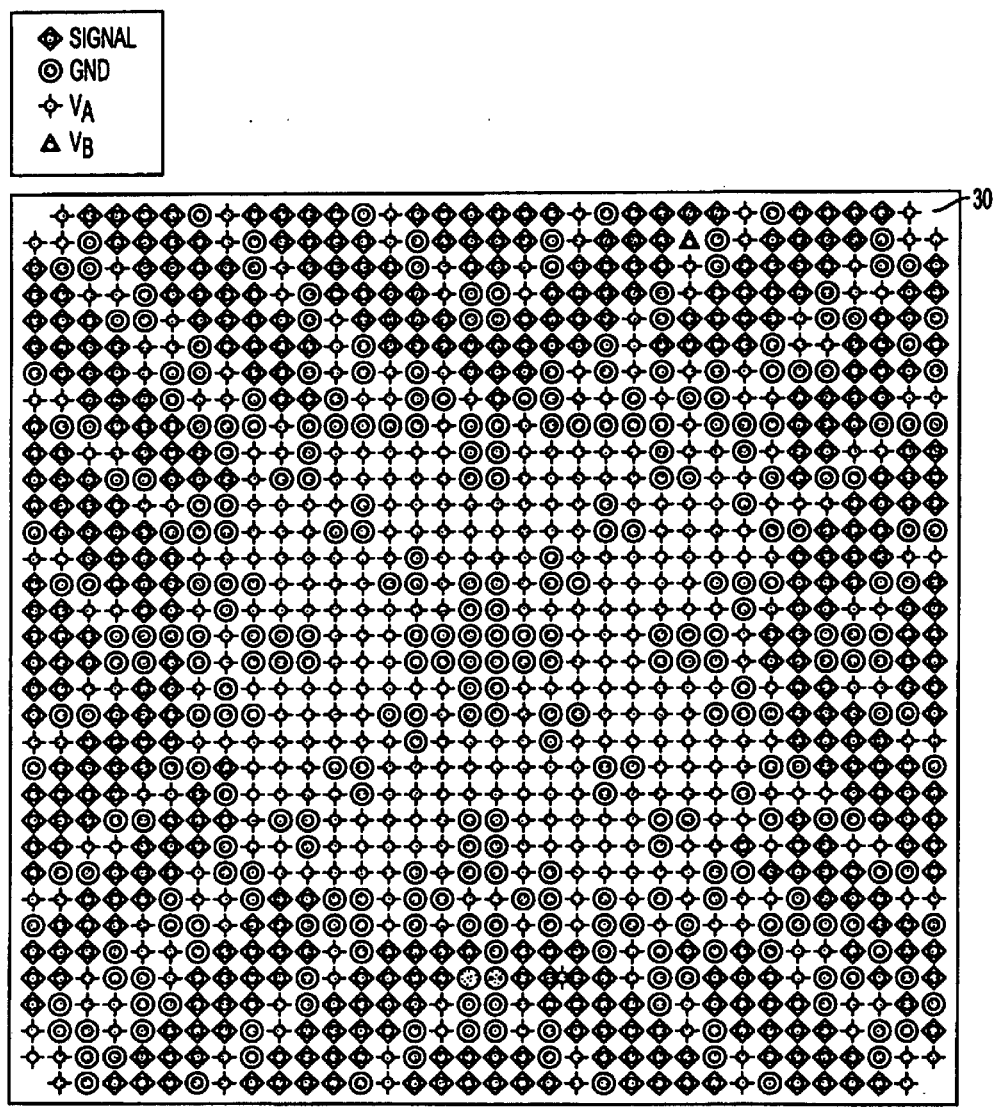
FIG. 2 shows a layout of a surface mount grid array package of an electronic component having 1152 pins.

Referring to FIG. 2, there is shown a layout 30 of a surface mount grid array package of an electronic component having 1152 input/output (I/O) contacts. FIG. 2 also shows a legend indicating the type of signal associated with I/O contact.

Figure 3:
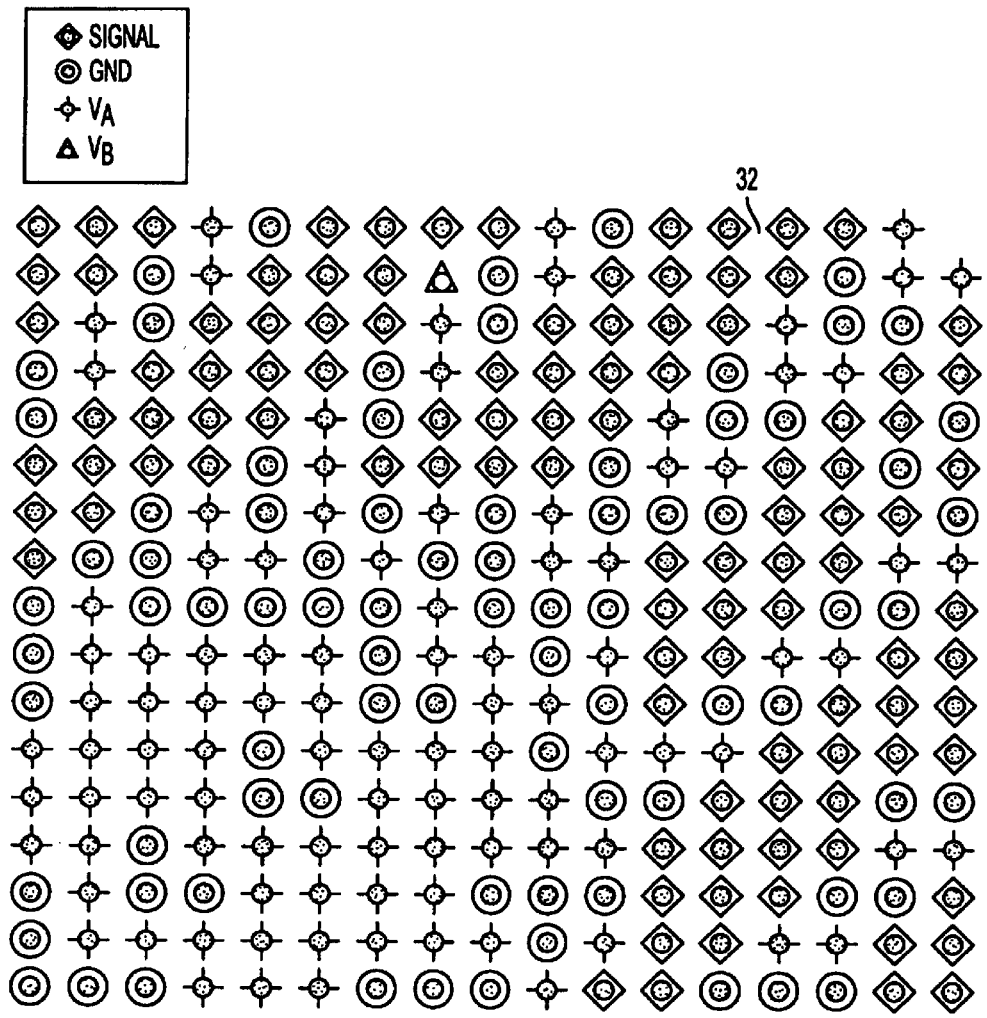
FIG. 3 shows one quadrant (i.e., the upper right quadrant) of the power/ground and signal pins on the top layer of the layout shown in FIG. 2.
Figure 4A:
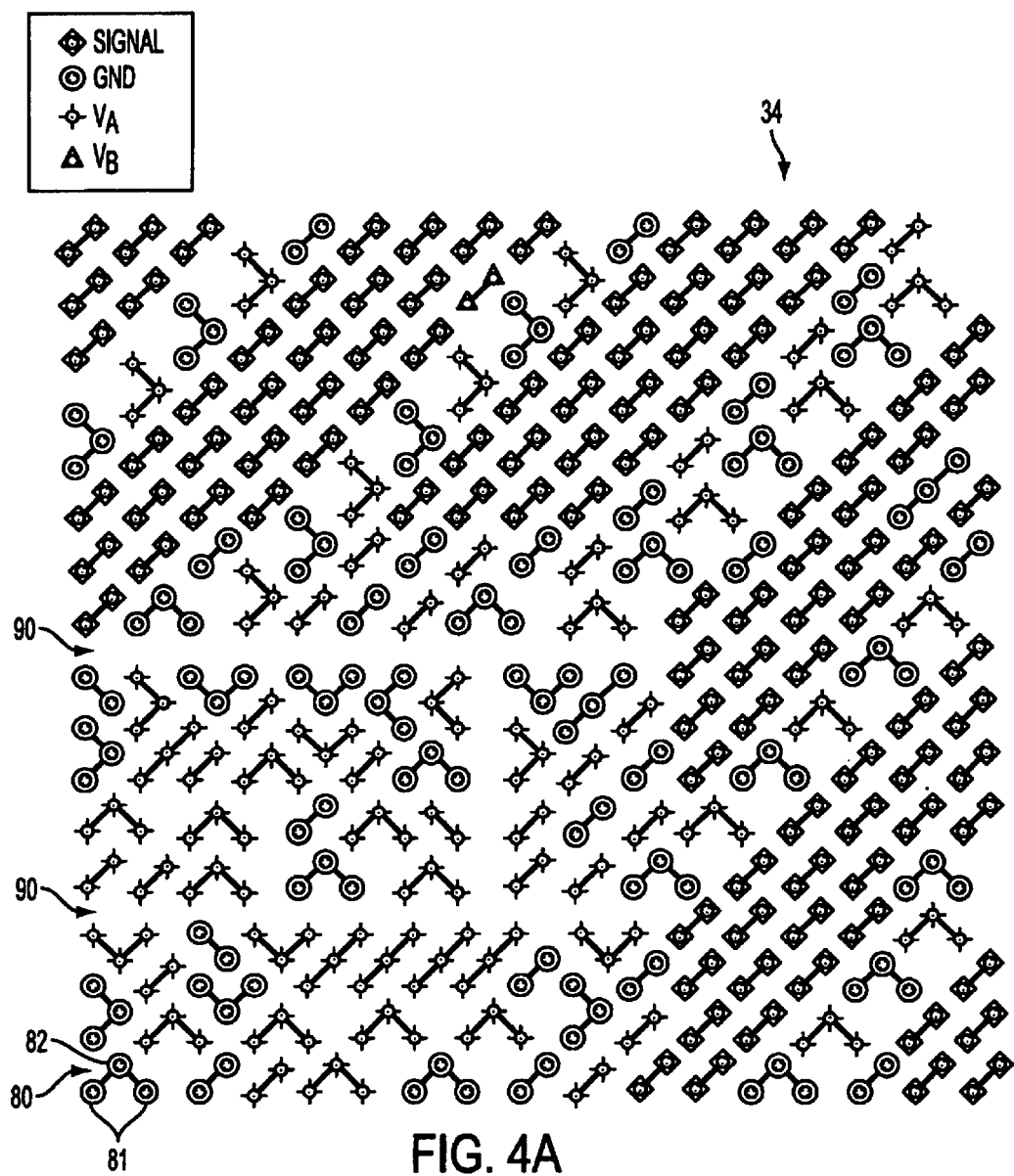
FIG. 4A shows the quadrant of FIG. 3 after via placement and pin connection.

In order to increase the resolution for purposes of better understanding this detailed description, FIG. 3 shows one quadrant 32 (i.e., the upper right quadrant) of the layout 30 shown in FIG. 2. FIGS. 4-7 directly coincide with the quadrant 32 shown in FIG. 3. The signal type legend in FIG. 2 also applies to FIG. 3, as well as to FIGS. 4B-7B. FIG. 4A does not use the legend symbols and is simplified for the sake of clarity. However, FIG. 4A shows the same quadrant as shown in FIGS. 2 and 3 and accordingly has the same layout.

Referring to FIG. 4A, there is shown a portion 34 of the primary layer 12 of the multilayer printed circuit board 10. As indicated above, this portion 34 of the primary layer 12 directly coincides with the quadrant 32 shown in FIG. 3. That is, this portion 34 of the primary layer 12 corresponds to the portion of the multilayer printed circuit board 10 where one quadrant of an electronic component having a surface mount grid array package with 1152 I/O contacts is mounted on the multilayer printed circuit board 10.

As indicated above, the primary layer 12 is primarily a power/ground plane layer except for contact pads and test signal runs formed thereon. More particularly, the primary layer 12 includes a ground plane that is electrically connected to ground contact pads (i.e., GND in legend), but is not electrically connected to power contact pads (i.e., VA and VB in legend), or signal contact pads (i.e., signal in legend).

As shown in FIG. 4A, the power routing technique of the invention strategically utilizes dog bone pads 80 including pins 81 and via 82 arranged in a specific pattern in order to create free channels 90. Note that most dog bone pads 80 used to create the channel include two pins 81. It is also possible to include more than two pins 81 per via 82 with some circuit board designs. All of the pins 81 associated with the via 82 should have the same potential. The doubling of power or ground pin connections 81 on a single via 82 in a specific pattern allows the formation of free channels 90. The doubling of pins 81 per via 82 not only allows formation of channels 90 on the surface of the primary layer 12, but also allows formation of channels in other layers as will be further explained below.

In many cases, there are just as many (if not more) power and ground pins versus signal pins in a single package. Therefore it can be seen that using power routing techniques opens up more continuous free channels that can then be used to route signals. Another advantage of the disclosed technique can be seen when routing differential pairs as it allows both signals to be routed side by side vs. being broken up by package pins.

Figure 4B:
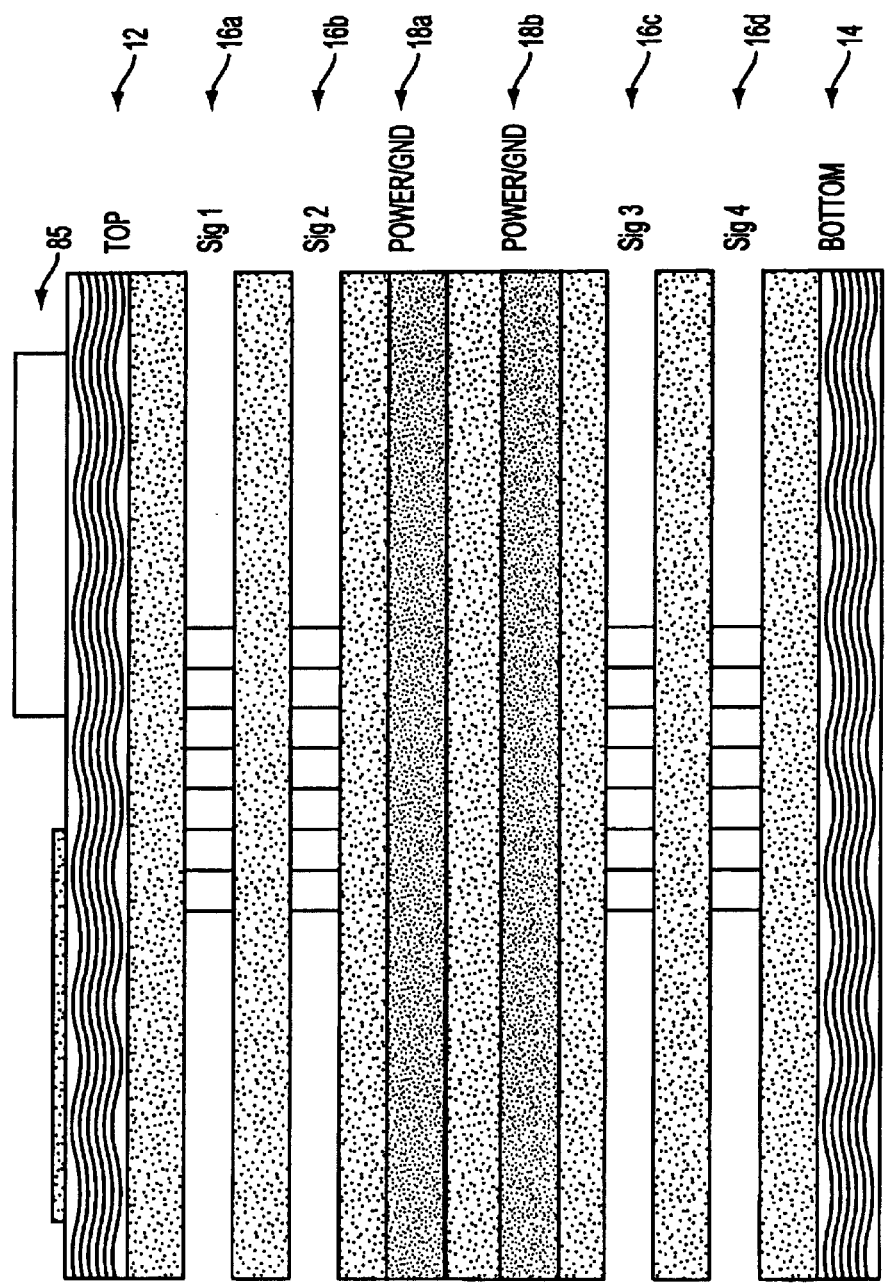
FIG. 4B shows a cross-sectional view of a multilayer printed circuit board corresponding to the ground (surface) plane layer portion of FIG. 4A.

FIG. 4B shows a cross-sectional view of the dog bone pads 80 and component pads 85 mounted on the primary layer 12. Each layer in FIG. 4B is corresponds to the layers described above in relation to FIG. 1.

Figure 5A:
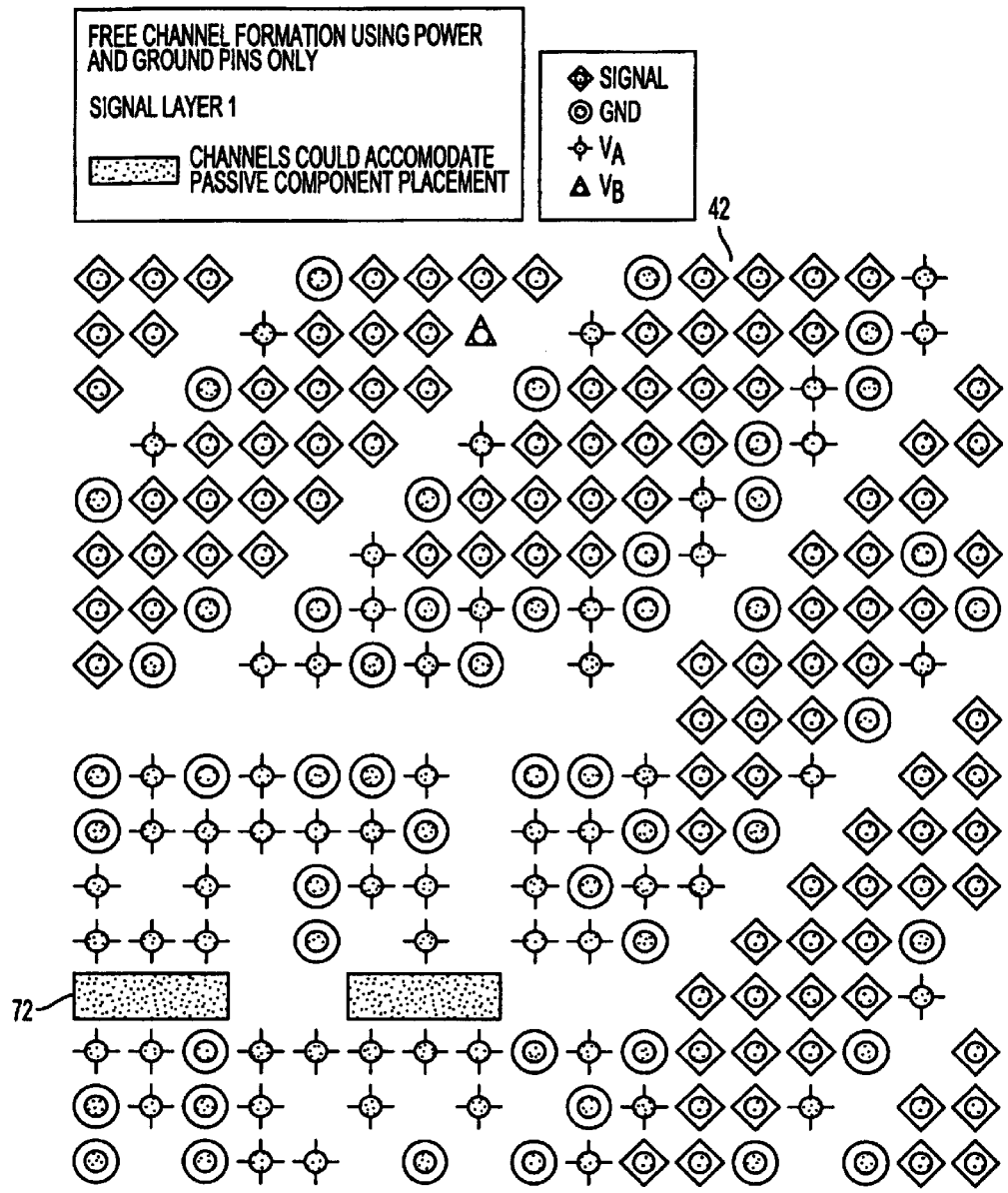
FIG. 5A shows a portion of a first signal layer of the multilayer printed circuit board shown in FIG. 1.

FIG. 5A shows a portion 42 of the signal layer 16a of the multilayer printed circuit board 10. As indicated above, this portion 42 of the signal layer 16a directly coincides with the quadrant 32 shown in FIG. 3. That is, this portion 42 corresponds to the portion of the multilayer printed circuit board 10 where one quadrant of an electronic component having a surface mount grid array package with 1152 I/O contacts is mounted on the multilayer printed circuit board 10. The signal layer 16a includes channels 72 for accommodating passive components. Unlike with signal channel routing, the power routed channels will actually form on the first signal layer 16a rather than the second signal layer 16b and therefore will provide better distribution of the signals and microvia channels.

Figure 5B:
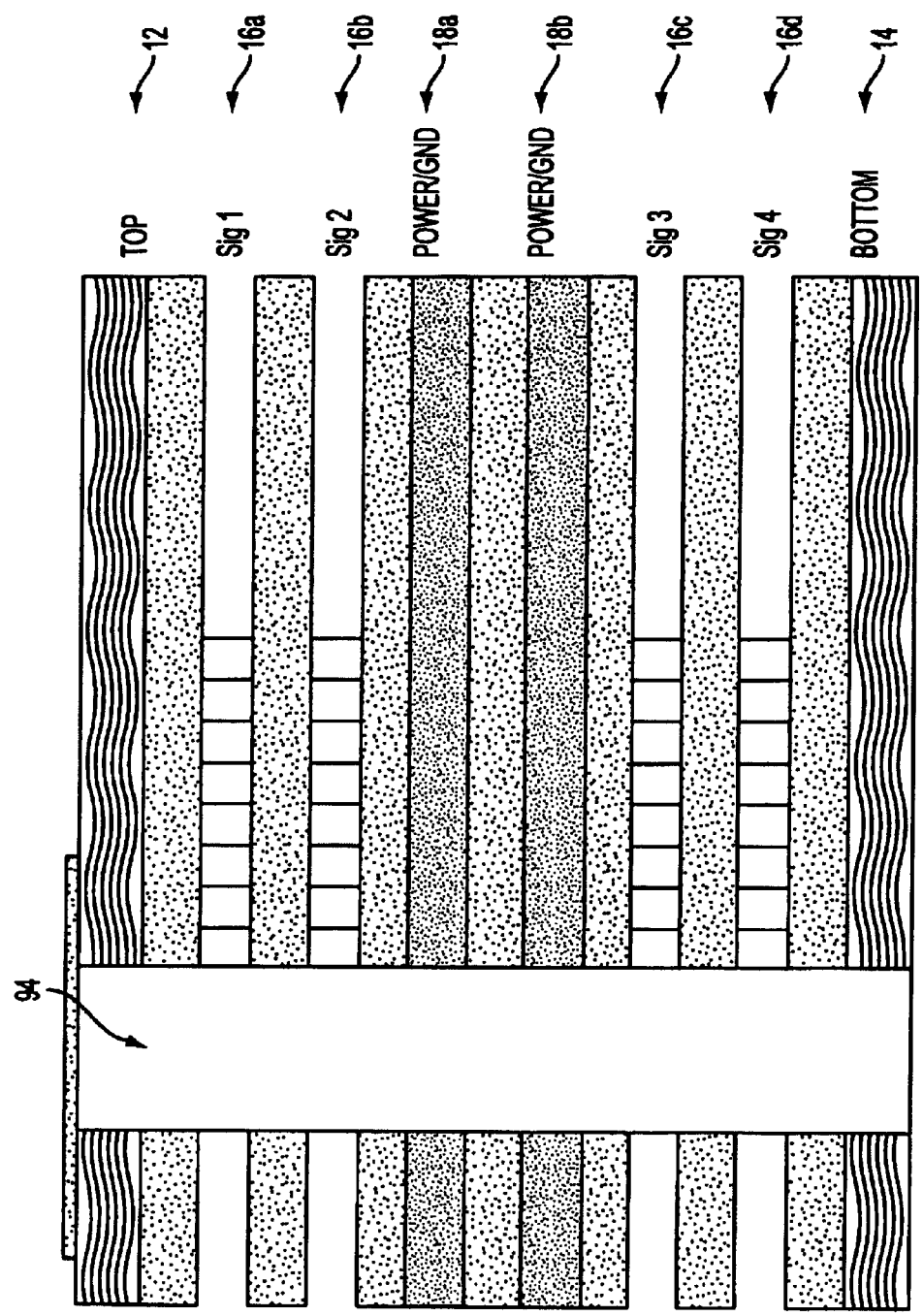
FIG. 5B shows a cross-sectional view of a multilayer printed circuit board corresponding to the signal layer portion of FIG. 6A.

FIG. 5B illustrates a cross-sectional view of the signal layer 16A. The choice of via 94 depends upon the selected design. The through hole via 94 was therefore selected due to the overall stack-up. The use of this through hole 94 causes channels to be opened on or below the layer 16A.

Figure 6A:
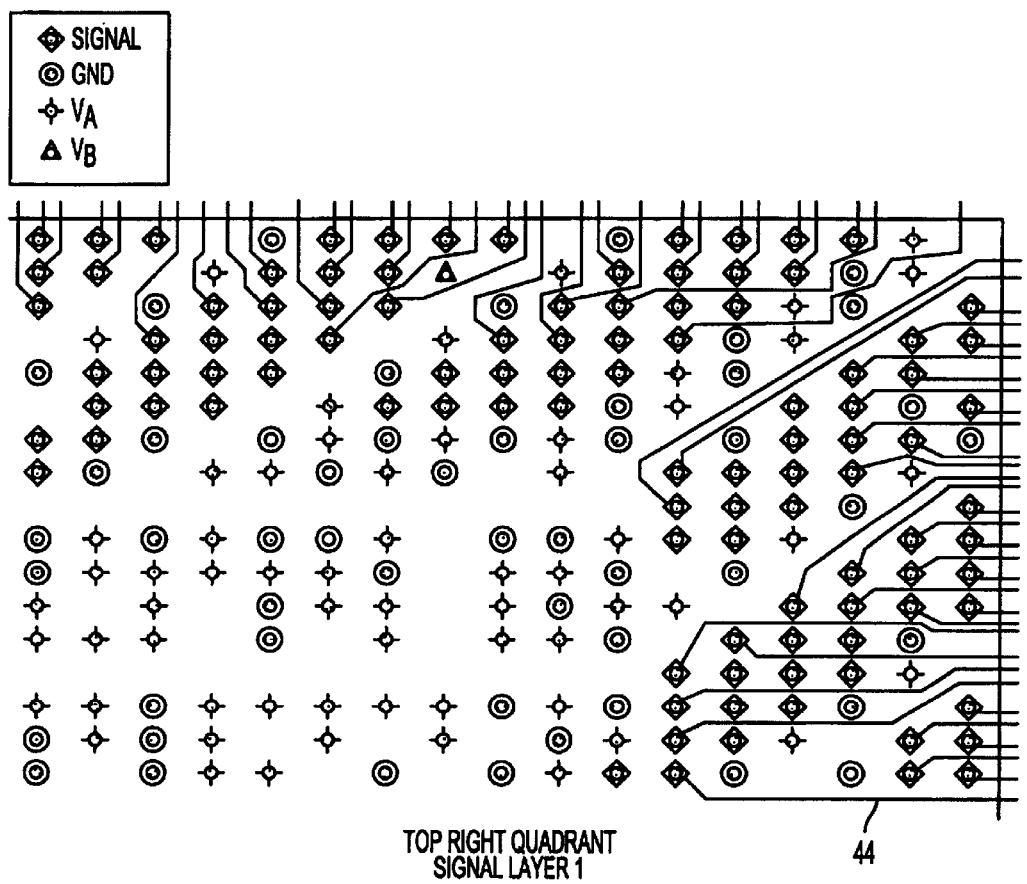
FIG. 6A shows channel routing of a portion of the first signal layer of the multilayer printed circuit board shown in FIG. 1.

FIG. 6A further illustrates the upper right quadrant of the signal layer 16A. The signal layer 16a includes a plurality of electrically conductive signal runs 44 that are electrically connected to dog bone vias in the multilayer printed circuit board 10 where channels are formed in other layers of the multilayer printed circuit board 10 in accordance with the present invention. These signal runs 44 are typically preselected based upon the characteristics of the signals they carry. That is, the signals runs 44 may carry high speed signals. Alternatively, the signals runs 44 may carry low speed signals.

Figure 6B:
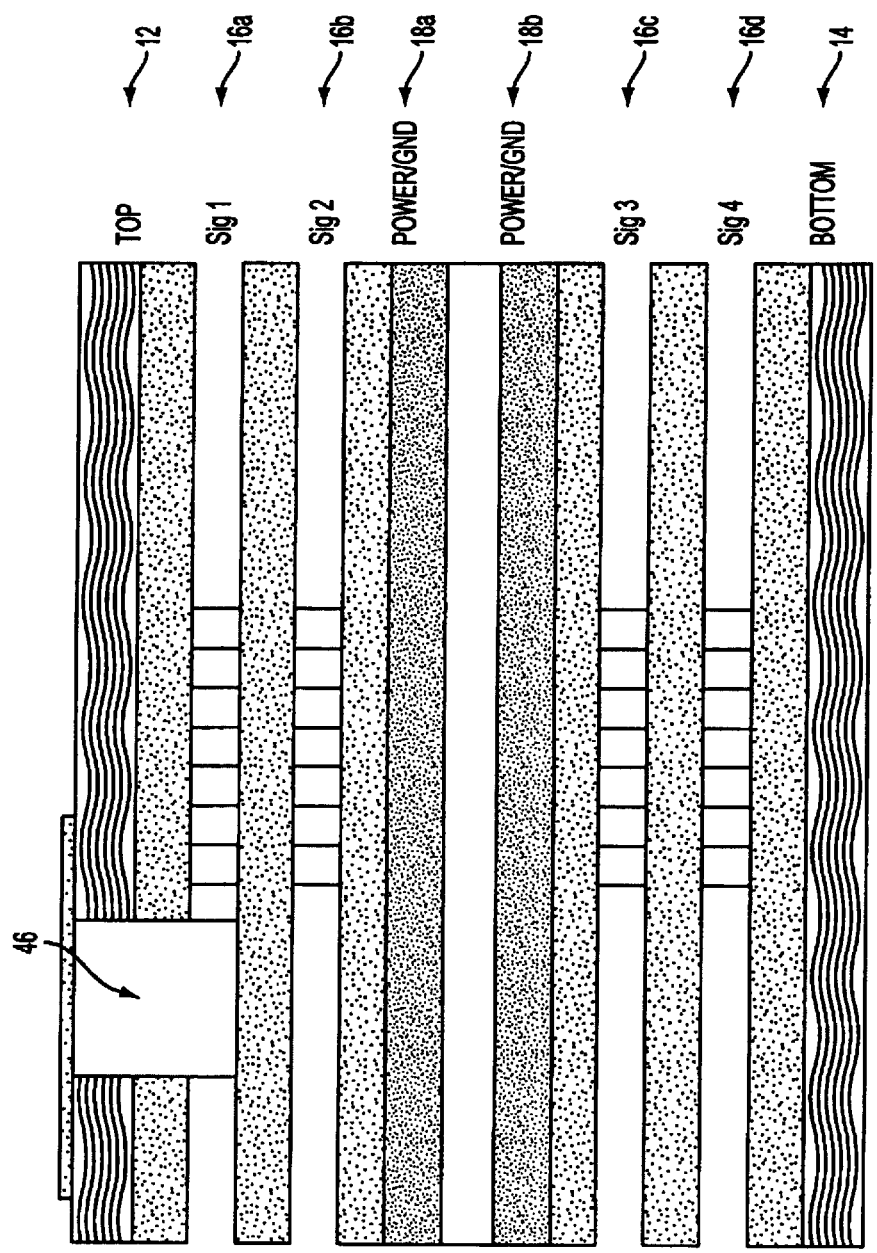
FIG. 6B shows a cross-sectional view of a multilayer printed circuit board corresponding to the signal layer portion of FIG. 4A.

Importantly, as shown in FIG. 6B, a microvia 46 that is formed in the multilayer printed circuit board 10 does not extend any further into the multilayer printed circuit board 10 than the signal layer 16a. This allows channels to be formed beneath these microvias 46 in other layers of the multilayer printed circuit board 10, as described in detail below.

Referring to FIG. 7A, there is shown a portion 48 of the signal layer 16b of the multilayer printed circuit board 10. As indicated above, this portion 48 of the signal layer 16b directly coincides with the quadrant 32 shown in FIG. 3. That is, this portion 48 of the signal layer 16b corresponds to the portion of the multilayer printed circuit board 10 where one quadrant of an electronic component having a surface mount grid array package with 1152 I/O contacts is mounted on the multilayer printed circuit board 10.

The signal layer 16b includes a plurality of electrically conductive signal runs 50 that are electrically connected to vias (shown in FIG. 7B) formed in the signal layer 16b. In accordance with the present invention, many of these signal runs 50 are routed in the channels 52. That is, the channels formed by the absence of vias in the signal layer 16b in the multilayer printed circuit board 10 allow the plurality of electrically conductive signal runs 50 to be routed therein. Otherwise, if vias were present in these areas 52 in this and other layers of the multilayer printed circuit board 10, then additional signal layers would be required to route the plurality of electrically conductive signal runs 50. Thus, the absence of vias in these areas 52 in this and other layers of the multilayer printed circuit board 10 allow for an overall reduction in the number of signal layers required in the multilayer printed circuit board 10. A massive channel 53 is created where the technique disclosed in U.S. patent application Ser. No. 09/651,188 is used in combination with the presently disclosed technique. The massive channel 53 allows routing of additional signals, thereby saving additional space.

Figure 7B:
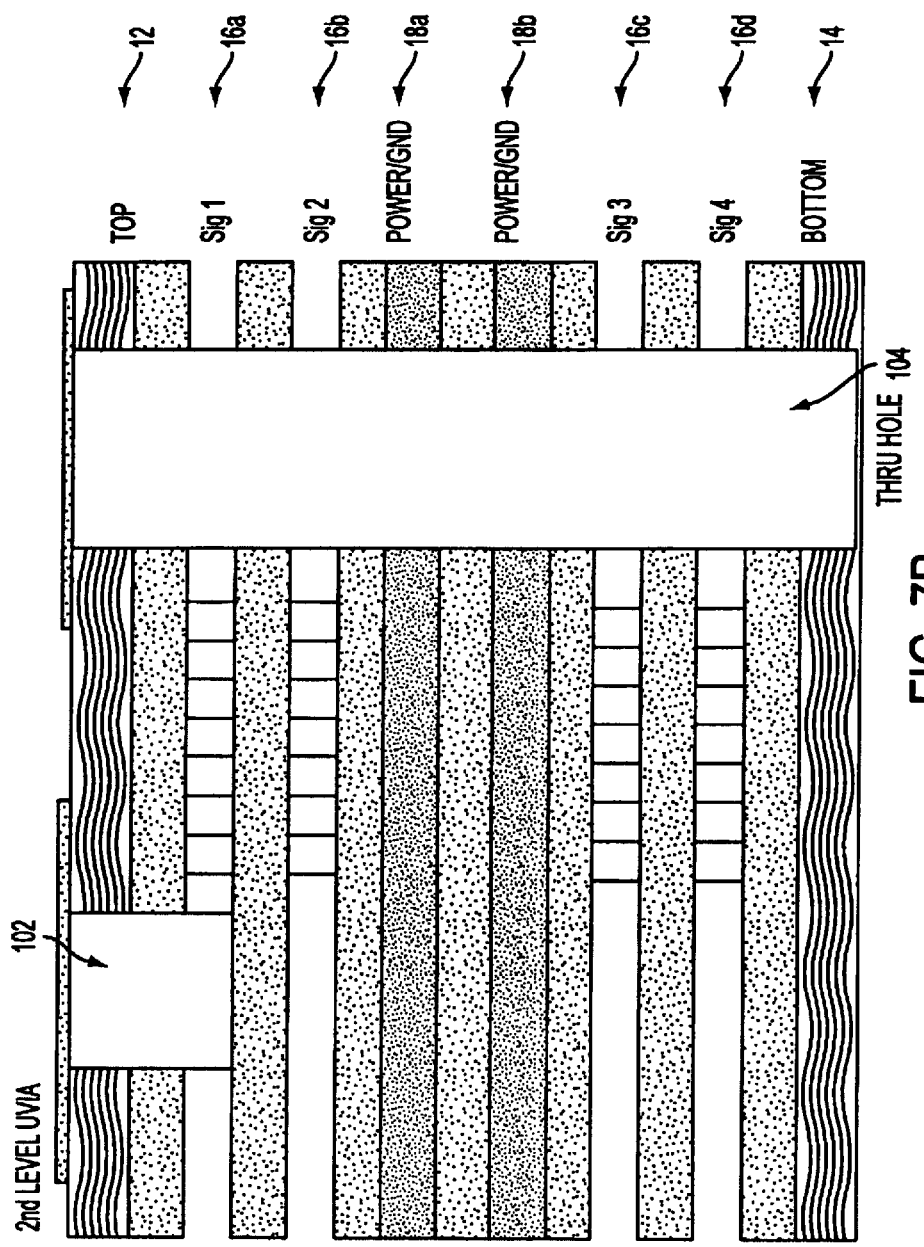
FIG. 7B shows a cross-sectional view of a multi-layer printed circuit board corresponding to the second signal layer portion of FIG. 7A.

A cross-sectional view of the second signal layer 16b is shown in FIG. 7B. A second level microvia 102 can be used in certain situations, particularly if overall layer depth is approximately 9 mil, (the current manufacturing limit). If a via such as the microvia 102 is impracticable due to manufacturing limits, a through hole 104 can be used. If a microvia is used for power routing, then the main channel formed will be present on all layers below the surface layer 12. Additionally, another channel will be opened on layers below the microvia (i.e. N+1, microvia Top—signal 1 (N=2) will not be visible on or above the third layer since the microvia is so shallow.)

Figure 8:
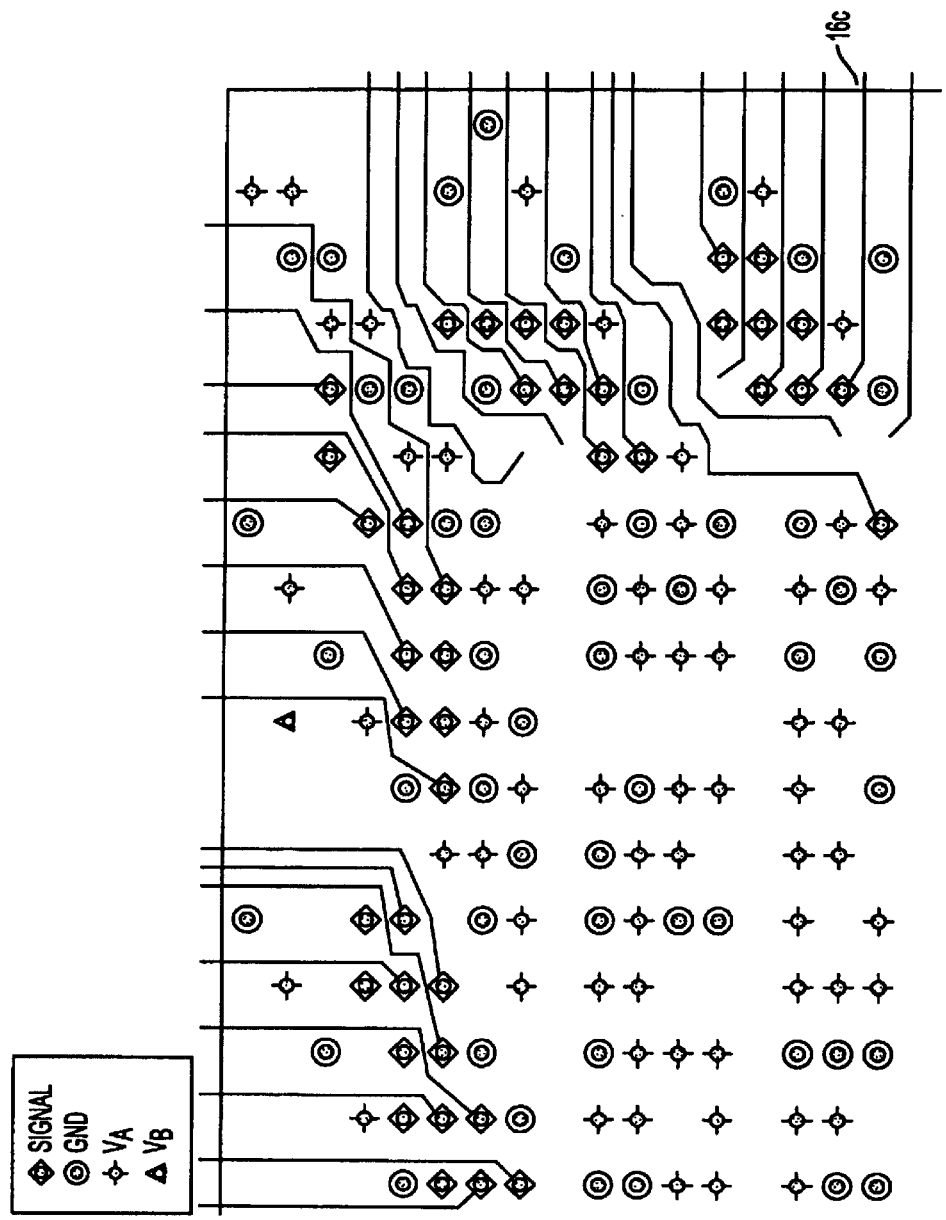
FIG. 8 shows a hypothetical $3^{rd}$ signal layer using conventional through hole design.

FIG. 8 shows the layer savings afforded by the technique of the invention. In particular, an additional 31 signals would have been required on signal layer 16c if conventional through hole design had been implemented. Accordingly, the technique of the invention (in conjunction with the previously disclosed free channel signal routing) has resulted in a savings of one layer.

Figure 9:
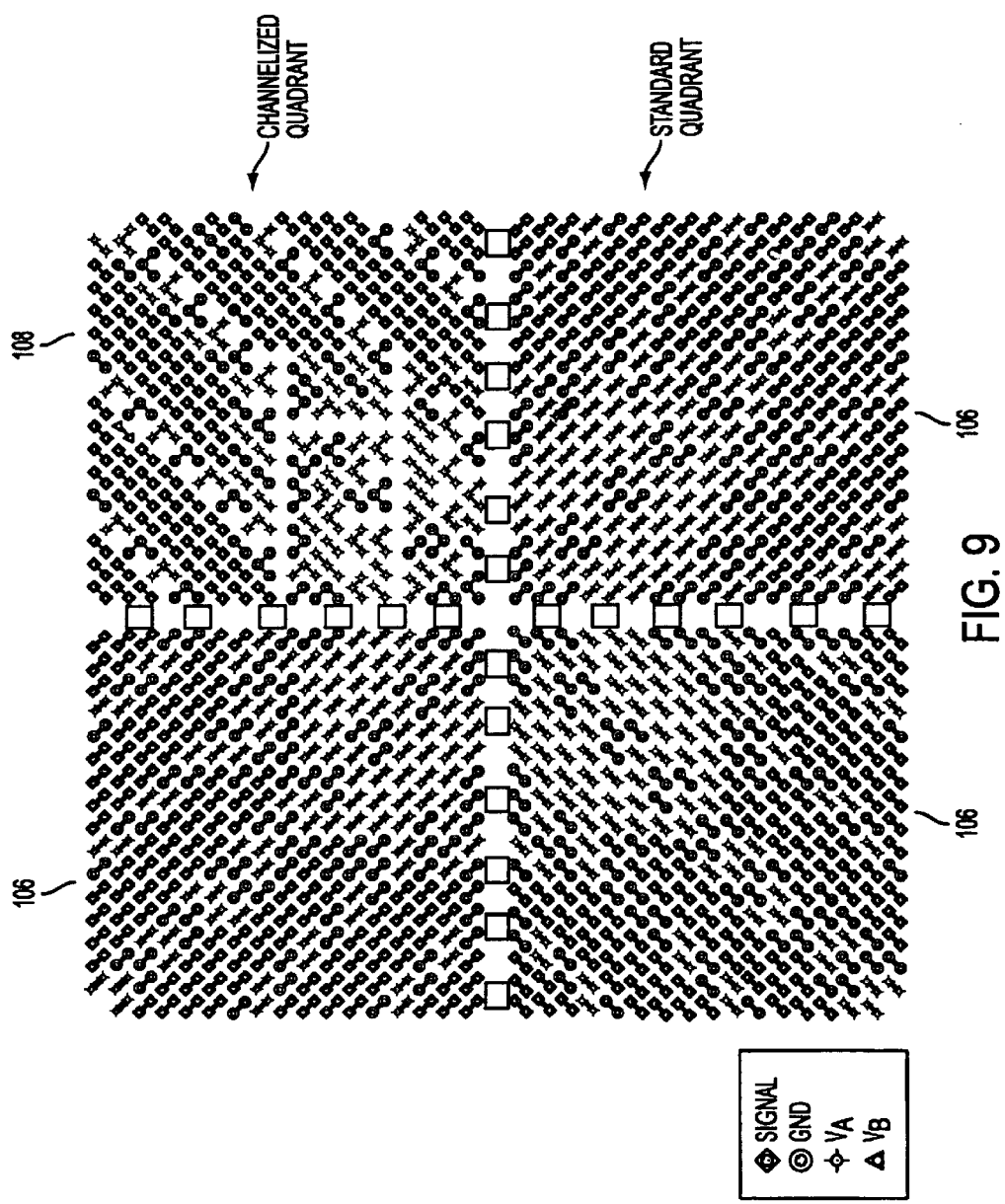
FIG. 9 shows all four quadrants of the multilayer board in which the upper right hand corner is a channelized quadrant.

FIG. 9 is provided merely to show the comparison between standard quadrants 106 and channelized quadrants 108. As FIG. 9 exemplifies, the channelized quadrant results in increased space savings.

Figure 10:
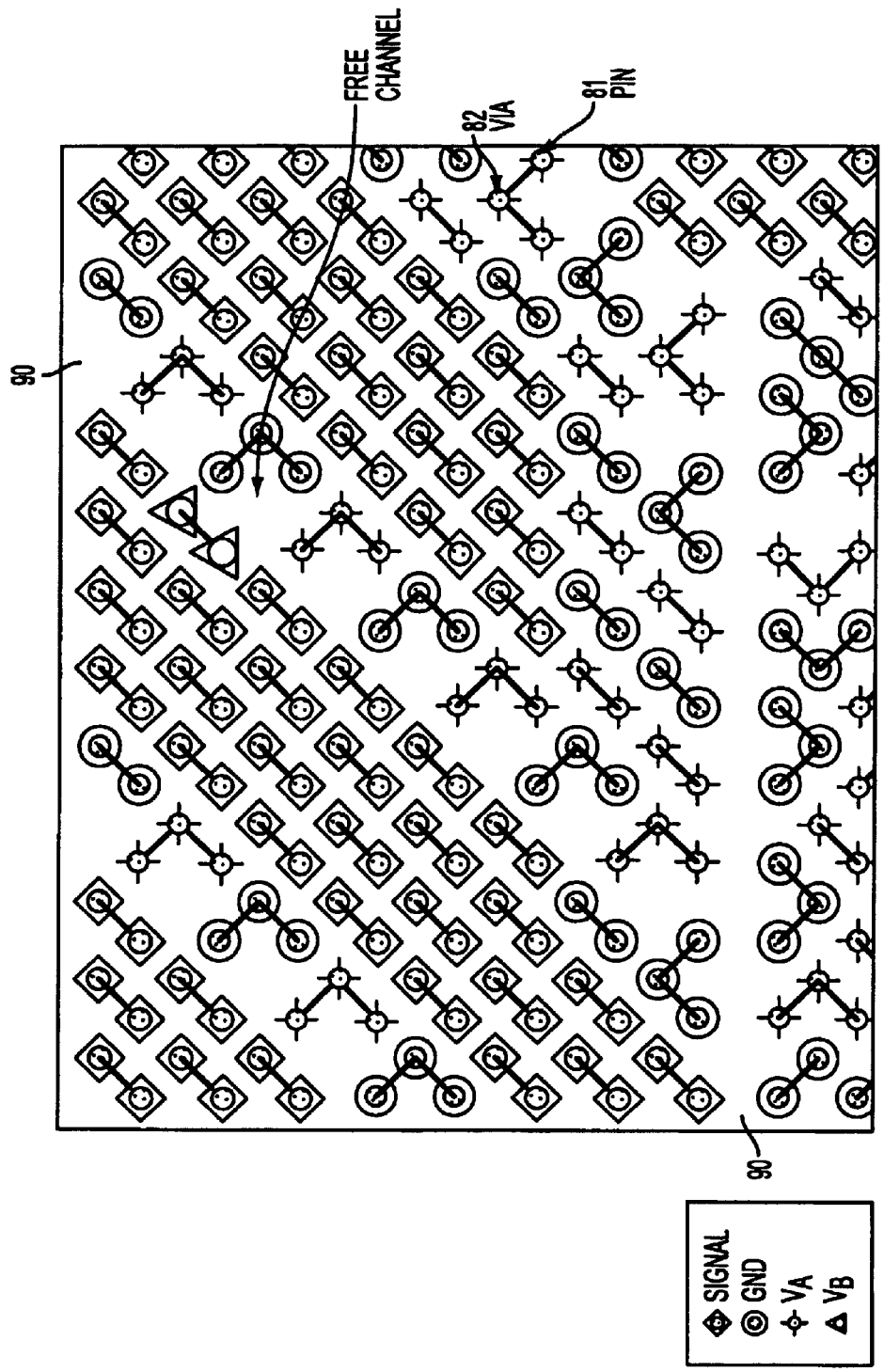
FIG. 10 shows doubling up of power pins in order create a free channel on a surface of the multilayer printed circuit board shown in FIG. 1.

FIG. 10 is an additional view of a potential power routing design for a primary layer 12. The free channels 90 result from the positioning of the dog bone pads 80 including pins 81 and via 82. The pins 81 may be power and/or ground pins of the same potential, but do not include signal pins.

Figure 11:
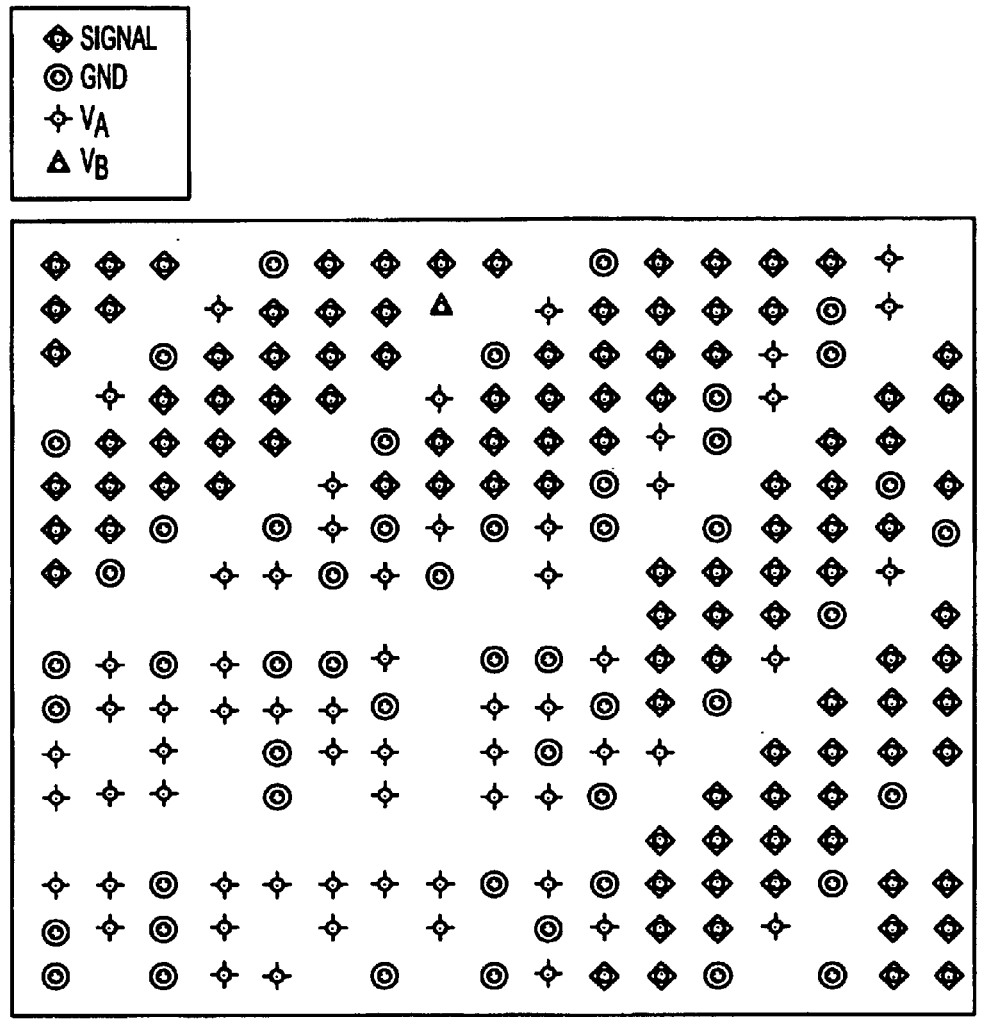
FIG. 11 shows a channelized quadrant of the multilayer printed circuit board of FIG. 1.

FIG. 11 illustrates a channelized quadrant 112 that may appear on any subsequent signal layers that can be combined with signal free channel routing as illustrated in FIG. 1 and as described in U.S. patent application Ser. No. 09/651,188 such that massive channels can be formed. Signal routing through these massive channels 53 is shown and described above with reference to FIG. 7A.

In summary, the disclosed power routing technique uses strategically placed through and microvia holes such the free channels can be obtained. Further with the use of microvias, the technique will allow clearance of spaces on subsequent layers within the package footprint which will allow for denser routing within the package.

This technique focuses on the layer reduction of printed circuit boards. Due to the increase in free channels higher number of signals can be taken out of the package per layer. Further combined with free channel routing the power routing disclosed in U.S patent application Ser. No. 09/651, 188, it allows for easier breakouts of high density packages and leads to higher cost savings.

Previously, although signal pins have been arranged in various patterns, the potential of achieving free channels by the application of power routing has not been explored. The technique of the invention allows free routing channel construction with the use of through hole vias (or microvias or any other type of blind via depending on the design and board stack-up) and strategic placement of the through hole (or microvia or blind via) vias with respect to power and ground pins. When combined with signal channel routing, the technique of the invention may be able to provide layer count reduction of 30–50%.

With regard to methodology, the steps used to solve the problem can be summarized as follows: a) Identification of power pins within package footprint; b) Strategic placement of vias such that free channels can be formed; and c) Connection of two or more pads, design permitting, to one via whereever possible.

As a further step, d) Power/ground routing can be used to complement signal free channels or vice versa by aligning the two channels together to form a "massive channel".

The present invention is not to be limited in scope by the specific embodiments described herein. Indeed, various modifications of the present invention, in addition to those described herein, will be apparent to those of ordinary skill in the art from the foregoing description and accompanying drawings. Thus, such modifications are intended to fall within the scope of the following appended claims. Further, although the present invention has been described herein in the context of a particular implementation in a particular environment for a particular purpose, those of ordinary skill in the art will recognize that its usefulness is not limited thereto and that the present invention can be beneficially implemented in any number of environments for any number of purposes. Accordingly, the claims set forth below should be construed in view of the full breadth and spirit of the present invention as disclosed herein.

What is claimed is:

1. A method for reducing the number of layers in a multilayer circuit board, the multilayer circuit board having a plurality of electrically conductive signal path layers for routing electrical signals to and from at least one electronic component mounted on a surface of the multilayer circuit board, the method comprising the steps of:

forming a plurality of electrically conductive vias in the multilayer circuit board extending from the surface of the multilayer circuit board to at least one of the plurality of electrically conductive signal layers;

arranging the surface such that a set of at least two power/ground pins is electrically connected to a via that extends only partially through the multilayer circuit board so as to create at least a portion of a channel on at least a first of the plurality of electrically conductive signal layers, the portion of the channel being located substantially beneath at least one of the at least two power/ground pins and adjacent to the via; and routing at least one electrical signal through the portion of the channel on the first of the plurality of electrically conductive signal layers.

2. The method of claim 1, wherein the portion of the channek is also located substantially beneath the via.

3. The method of claim 1, further comprising the step of arranging the surface such that at least one additional set of at least two power/ground pins is electrically connected to a respective via so as to create at least a second portion of the channel on at least the first of the plurality of electrically conductive signal layers, the second portion of the channel being located substantially beneath at least one power/ground pin of each of the at least one additional set of at least two power/ground pins and adjacent to the respective via in order to lengthen the channel.

4. The method of claim 1, further comprising the step of creating the via as a microvia.

5. The method of claim 1, further comprising the step of creating a channel on a second of the plurality of electrically conductive signal layers.

6. The method of claim 5, further comprising the step of routing at least one electrical signal path through the channel on the second of the plurality of signal layers.

7. The method of claim 1, further comprising the step of forming additional electrically conductive vias in the multilayer circuit board extending from the surface of the multilayer circuit board to a first of the plurality of electrically conductive signal layers, the additional electrically conductive vias being arranged so as to form a channel in a second of the plurality of electrically conductive signal layers beneath the first plurality of electrically conductive vias.

8. The method of claim 1, further comprising the step of separating the plurality of electrically conductive signal layers by at least one dielectric layer.

9. The method of claim 1, further comprising the step of arranging the plurality of electrically conductive vias in order to configure the portion of the channel to have a preselected width.

10. The method of claim 1, further comprising the step of arranging the plurality of electrically conductive vias in order to configure the portion of the channel to have a pre-selected shape including one of rectangular, square, circular, and diagonal.

11. A multilayer circuit board, the multilayer circuit board having a plurality of electrically conductive signal layers for routing electrical signals to and from at least one electronic component mounted on a surface of the multilayer circuit board, wherein at least some of the plurality of electrically conductive signal layers are separated by at least one electrically conductive power/ground layer, the multilayer circuit board comprising:

a plurality of electrically conductive vias in the multilayer circuit board extending from the surface of the multilayer circuit board to at least one of the plurality of electrically conductive signal layers, the surface being arranged such that a set of at least two power/ground pins is electrically connected to a via that extends only partially through the multilayer circuit board so as to create at least a portion of a channel on a first of the plurality of signal layers, the portion of the channel being located substantially beneath at least one of the at least two power/ground pins and adjacent to the via; and at least one electrical signal path routed through the portion of the channel on the first of the plurality of electrically conductive signal layers.

12. The multilayer circuit board of claim 11, wherein portion of the channel is also located substantially beneath via.

13. The multilayer circuit board of claim 11, further comprising at least one additional set of at least two power/ground pins electrically connected to a respective via and being arranged so as to create at least a second portion of the channel on at least the first of the plurality of electrically conductive signal layers, the second portion of the channel being located substantially beneath at least one power/ground pin of each of the at least one additional set of at least two power/ground pins and adjacent to the respective via in order to lengthen the channel.

14. The multilayer circuit board of claim 11, wherein the via is a microvia.

15. The multilayer circuit board of claim 11, further comprising a channel on a second of the plurality of electrically conductive signal layers.

16. The multilayer circuit board of claim 15, further comprising at least one electrical signal path routed through the channel on the second of the plurality of electrically conductive signal layers.

17. The multilayer circuit board of claim 11, further comprising additional electrically conductive vias in the multilayer circuit board extending from the surface of the multilayer circuit board to a first of the plurality of electrically conductive signal layers, the additional electrically conductive vias being arranged so as to form a channel in a second of the plurality of electrically conductive signal layers beneath the first plurality of electrically conductive vias.

18. The multilayer circuit board of claim 11, further comprising at least one dielectric layer separating the plurality of electrically conductive signal layers.

19. The multilayer circuit board of claim 11, wherein the plurality of electrically conductive vias are arranged so as to configure the portion of the channel to have a preselected width.

20. A method for reducing the number of layers in a mulilayer circuit board, the multilayer circuit board having a plurality of electrically conductive signal layers for routning electrical signals to and form at least one electronic component mounted on a surfae of the multilayer circuit board, the method comprising the steps of:

forming a plurality of electrically conductive vias in the multilayer circuit board extending from the surface of the multilayer circuit board to at least one of the plurality of electrically conductive signal layers;

arranging the surface such that a set of at least two power/ground pins is electrically connected to a via that extends only partially through the multilayer circuit board so as to create at least a portion of a channel on at least a first of the plurality of electrically conductive signal layers, the portion of the channel being located substantially beneath at least one of the at least two power/ground pins; and routing at least one electrical signal path through the portion of the channel on the first of the plurality of electrically conductive signal layers.

21. The method of claim 20, wherein the portion of the channel is also located substantially beneath the via.

22. The method of claim 20, further comprising the step of creating the via as a microvia.

23. A multilayer circuit board, the multilayer circuit board having a plurality of electrically conductive signal layers for routing electrical signals to and from at least one electronic component mounted on a surface of the multilayer circuit board, the multilayer circuit board comprising:

a plurality of electrically conductive vias in the multilayer circuit board extending from the surface of the multilayer circuit board to at least one of the plurality of electrically conductive signal layers, the surface being arranged such that a set of at least two power/ground pins is electrically connected to a via that extends only partially through the multilayer circuit board so as to create at least a portion of a channel on a first of the plurality of signal layers, the portion of the channel being located substantially beneath at least one of the at least two power/ground pins; and at least one electrical signal path routed through the portion of the channel on the first of the plurality of electrically conductive signal layers.

24. The multilayer circuit board of claim 23, wherein the portion of the channel is also located substantially beneath the via.

25. The multilayer circuit board of claim 23, wherein the via is a microvia.

26. A method for reducing the number of layers in a multilayer circuit board, the multilayer circuit board having a plurality of electrically conductive signal layers for routing electrical signals to and from at least one electronic component mounted on a surface of the multilayer circuit board, the method comprising the steps of:

forming a first electrically conductive via in the multilayer circuit board extending from the surface of the multilayer circuit board to at least one of the plurality of electrically conductive signal layers;

forming a second electrically conductive via in the multilayer circuit board extending from the surface of the multilayer circuit board to at least one of the plurality of electrically conductive signal layers;

arranging the surface such that a set of at least two power/ground pins is electrically connected to the first electrically conductive via so as to create at least a portion of a first channel on at least a first of the plurality of electrically conductive signal layers and to create at least a portion of a second channel on at least a second of the plurality of electrically conductive signal layers, the portion of the first channel being located substantially beneath at least one of the at least two power/ground pins and adjacent to the first electrically conductive via, the portion of the second channel being located substantially beneath the second electrically conductive via; and routing at least one first electrical signal path through the portion of the first channel on the first of the plurality of electrically conductive signal layers and routing at least one second electrical signal path through the portion of the second channel on the second of the plurality of electrically conductive signal layers.

27. The method of claim 26, wherein the first of the plurality of electrically conductive signal layers is the same as the second of the plurality of electrically conductive signal layers.

28. The method of claim 26, wherein the at least one first electrical signal path is the same as the at least one second electrical signal path.

29. A multilayer circuit board, the multilayer circuit board having a plurality of electrically conductive signal layers for routing electrical signals to and from at least one electronic component mounted on a surface of the multilayer circuit board, the multilayer circuit board comprising:

a first electrically conductive via formed in the multilayer circuit board extending from the surface of the multilayer circuit board to at least one of the plurality of electrically conductive signal layers;

a second electrically conductive via formed in the multilayer circuit board extending from the surface of the multilayer circuit board to at least one of the plurality of electrically conductive signal layers;

wherein the surface is arranged such that a set of at least two power/ground pins is electrically connected to the first electrically conductive via so as to create at least a portion of a first channel on at least a first of the plurality of electrically conductive signal layers and to create at least a portion of a second channel on at least a second of the plurality of electrically conductive signal layers, the portion of the first channel being located substantially beneath at least one of the at least two power/ground pins and adjacent to the first electrically conductive via, the portion of the second channel being located substantially beneath the second electrically conductive via;

at least one first electrical signal path routed through the portion of the first channel on the first of the plurality of electrically conductive signal layers; and at least one second electrical signal path routed through the portion of the second channel on the second of the plurality of electrically conductive signal layers.

30. The multilayer circuit board of claim 29, wherein the first of the plurality of electrically conductive signal layers is the same as the second of the plurality of electrically conductive signal layers.

31. The multilayer circuit board of claim 29, wherein the at least one first electrical signal path is the same as the at least one second electrical signal path.

* * * * *